(12) United States Patent
Dabrowski et al.

(10) Patent No.: US 12,476,361 B2
(45) Date of Patent: Nov. 18, 2025

(54) FLEXIBLE PHASED ARRAY ANTENNA SYSTEMS AND METHODS

(71) Applicant: THE BOEING COMPANY, Chicago, IL (US)

(72) Inventors: Ted Dabrowski, Madison, AL (US); Adriana Jara, Madison, AL (US); Kalsi Kar Ning Kwan, Huntsville, AL (US); John D. Williams, Decatur, AL (US)

(73) Assignee: The Boeing Company, Arlington, VA (US)

( * ) Notice: Subject to any disclaimer, the term of this patent is extended or adjusted under 35 U.S.C. 154(b) by 268 days.

(21) Appl. No.: 17/872,313

(22) Filed: Jul. 25, 2022

(65) Prior Publication Data

US 2024/0030600 A1   Jan. 25, 2024

(51) Int. Cl.
*H01Q 3/36* (2006.01)
*H05K 1/02* (2006.01)
*H05K 1/11* (2006.01)

(52) U.S. Cl.
CPC .............. *H01Q 3/36* (2013.01); *H05K 1/0218* (2013.01); *H05K 1/025* (2013.01); *H05K 1/028* (2013.01); *H05K 1/115* (2013.01); *H05K 2201/10098* (2013.01)

(58) Field of Classification Search
CPC ........ H01Q 3/36; H05K 1/0218; H05K 1/025; H05K 1/028; H05K 1/115; H05K 2201/10098
See application file for complete search history.

(56) References Cited

U.S. PATENT DOCUMENTS

| | | | | |
|---|---|---|---|---|
| 4,176,359 A | * | 11/1979 | Fassett | H01Q 25/02 342/368 |
| 4,924,236 A | * | 5/1990 | Schuss | H01Q 9/0442 343/859 |
| 10,594,028 B2 | * | 3/2020 | Yong | H01Q 1/38 |
| 11,088,453 B1 | * | 8/2021 | Coutts | H05K 1/0243 |
| 11,177,567 B2 | * | 11/2021 | Khalil | H04B 17/21 |

(Continued)

OTHER PUBLICATIONS

Hashemi, M.R.M., Fikes, A.C., Gal-Katziri, M. et al. A flexible phased array system with low areal mass density. Nat Electron 2, 195¿205 (2019), https://doi.org/10.1038/s41928-019-0247-9.

(Continued)

*Primary Examiner* — Dimary S Lopez Cruz
*Assistant Examiner* — Jordan E. DeWitt
(74) *Attorney, Agent, or Firm* — Joseph M. Butscher; The Small Patent Law Group LLC

(57) ABSTRACT

A phased array antenna system includes a flexible printed circuit board formed of a flexible material. The flexible printed circuit board includes a component layer, an antenna layer, and a phase matching layer between the component layer and the antenna layer. A control unit is coupled to the component layer. A plurality of antenna elements are coupled to the antenna layer. A plurality of signal paths extend through the component layer, the phase matching layer, and the antenna layer. Each of the plurality of signal paths connects the control unit to a respective one of the plurality of antenna elements. The control unit provides an independent phase controllable source, which allows beams emitted from the antenna elements to be steered.

18 Claims, 4 Drawing Sheets

(56) References Cited

U.S. PATENT DOCUMENTS

| | | | | |
|---|---|---|---|---|
| 11,658,398 B1* | 5/2023 | Downey | | H01Q 5/378 |
| | | | | 343/705 |
| 2002/0084945 A1* | 7/2002 | Huebner | | H01Q 21/0006 |
| | | | | 343/700 MS |
| 2007/0152903 A1* | 7/2007 | Lin | | H01Q 9/26 |
| | | | | 343/795 |
| 2007/0201535 A1* | 8/2007 | Ahmed | | H04B 1/7136 |
| | | | | 375/135 |
| 2012/0108193 A1* | 5/2012 | Small | | H01Q 9/42 |
| | | | | 455/269 |
| 2012/0235881 A1* | 9/2012 | Pan | | H01Q 25/00 |
| | | | | 343/893 |
| 2013/0102240 A1* | 4/2013 | Helfers | | H04B 7/18513 |
| | | | | 455/3.02 |
| 2013/0141299 A1* | 6/2013 | Mast | | H05K 1/0278 |
| | | | | 29/601 |
| 2015/0015453 A1* | 1/2015 | Puzella | | H05K 1/0206 |
| | | | | 333/1.1 |
| 2019/0252775 A1* | 8/2019 | Mahanfar | | H05K 1/144 |
| 2019/0379134 A1* | 12/2019 | Paulotto | | H01Q 21/062 |
| 2020/0321690 A1* | 10/2020 | Paulotto | | H01Q 1/22 |
| 2020/0335873 A1* | 10/2020 | Achour | | H01Q 5/371 |
| 2021/0143553 A1* | 5/2021 | Dabrowski | | H01Q 13/16 |
| 2022/0149522 A1* | 5/2022 | Eom | | H01Q 3/26 |
| 2023/0216180 A1* | 7/2023 | Lee | | H01Q 21/065 |
| | | | | 343/702 |
| 2024/0030600 A1* | 1/2024 | Dabrowski | | H05K 1/028 |

OTHER PUBLICATIONS

M. Gal-Katziri, A. Fikes, F. Bohn, B. Abiri, M. R. Hashemi and A. Hajimiri, "Scalable, Deployable, Flexible Phased Array Sheets," 2020 IEEE/MTT-S International Microwave Symposium (IMS), 2020, pp. 1085-1088, doi: 10.1109/IMS30576.2020.9224066.

* cited by examiner

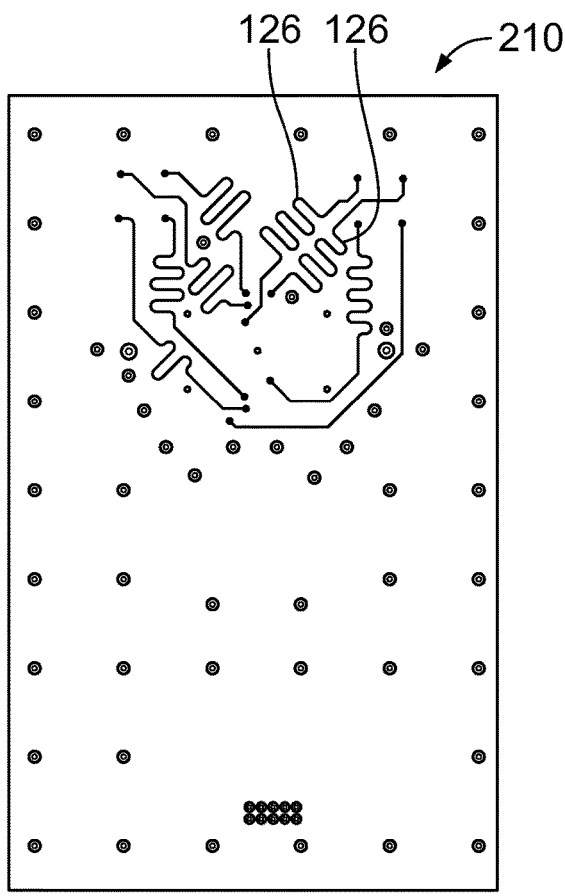 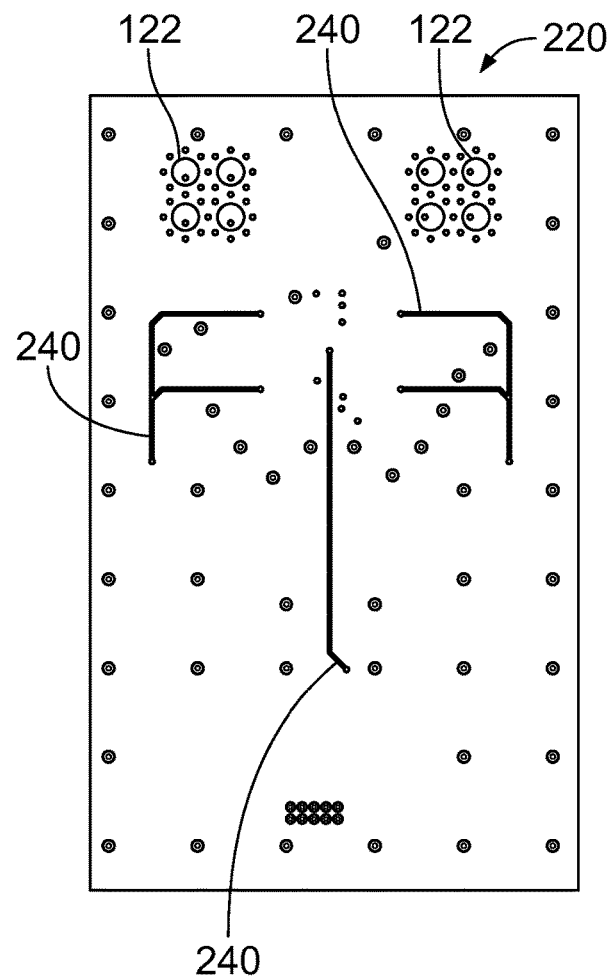
FIG. 4  FIG. 5

FLEXIBLE PHASED ARRAY ANTENNA SYSTEMS AND METHODS

FIELD OF THE DISCLOSURE

Examples of the present disclosure generally relate to flexible phased array antenna systems and methods.

BACKGROUND OF THE DISCLOSURE

An antenna typically includes an array of conductors electrically connected to a receiver or a transmitter. The transmitter provides an electric current to terminals of the antenna, which, in response, radiates electromagnetic waves. Alternatively, as radio waves are received by the antenna, an electrical current is generated at the terminals, which, in turn is applied to the receiver. Various types of known antennas are configured to transmit and receive radio waves with a reciprocal behavior.

In some aerospace applications, there is a need for antennas that are capable of being positioned on conformal or non-planar surfaces, such as wings and fuselages of aircraft. Small aircraft, such as unmanned aerial vehicles (UAVs) or drones, in particular, have surfaces with low radii of curvature. Such aircraft typically need light weight antennas with low aerodynamic drag and low visibility.

Flexible hybrid electronics (FHE) combine the functionality of rigid printed circuit boards with the adaptability of flexible circuits. FHEs are becoming increasingly desirable due to their potential to provide flexible, low size, low weight, low power, and low cost sensors and systems.

Various known phased array antenna systems are costly, and typically intended for high cost applications such as aircraft navigation, weapon systems, and/or long range communications. Such systems are generally large in area, have numerous layers (thereby leading to a thick and rigid system), and are complicated to design and construct. Accordingly, such systems are generally not suitable for low cost mission systems.

SUMMARY OF THE DISCLOSURE

A need exists for an efficient and effective flexible phased array antenna system. Further, a need exists for a flexible phased array antenna system that is cost-effective and easier to manufacture.

With those needs in mind, certain examples of the present disclosure provide a phased array antenna system including a flexible printed circuit board formed of a flexible material. The flexible printed circuit board includes a component layer, an antenna layer, and a phase matching layer between the component layer and the antenna layer. A control unit is coupled to the component layer. A plurality of antenna elements are coupled to the antenna layer. A plurality of signal paths extend through the component layer, the phase matching layer, and the antenna layer. Each of the plurality of signal paths connects the control unit to a respective one of the plurality of antenna elements. The control unit provides an independent phase controllable source, which allows beams emitted from the antenna elements to be steered.

In at least one example, each of the plurality of signal paths has an equal length.

In at least one example, each of the plurality of signal paths includes a phase match trace on or within the phase matching layer. In a further example, the phase match trace for each of the plurality of signal paths has an equal length.

In at least one example, each of the plurality of signal paths includes one or more vias. For example, each of the plurality of signal paths includes a first via connected to the control unit, a phase match trace connected to the first via, and a second via connected to the phase match trace.

In at least one example, at least one ground layer is disposed between the component layer and the phased array matching layer. In at least one example, at least one ground layer is disposed between the antenna layer and the phased array matching layer.

In at least one example, a plurality of radio frequency (RF) fences are disposed within the antenna layer. Each of the RF fences is associated with a respective one of the plurality of antenna elements.

Certain examples of the present disclosure provide a phased array antenna method including coupling a control unit to a component layer of a flexible printed circuit board formed of a flexible material; coupling a plurality of antenna elements to an antenna layer of the flexible printed circuit board; and providing a plurality of signal paths through the component layer, a phase matching layer of the flexible printed circuit board, and the antenna layer, wherein the phase matching layer is between the component layer and the antenna layer, wherein said providing comprises connecting each of the plurality of signal paths to the control unit and a respective one of the plurality of antenna elements, and wherein the control unit provides an independent phase controllable source, which allows beams emitted from the antenna elements to be steered.

BRIEF DESCRIPTION OF THE DRAWINGS

FIG. 4 illustrates a top view of a phase matching layer of the antenna system of FIG. 2.

FIG. 5 illustrates a top view of an antenna layer of the antenna system of FIG. 2.

DETAILED DESCRIPTION OF THE DISCLOSURE

Figure 1:
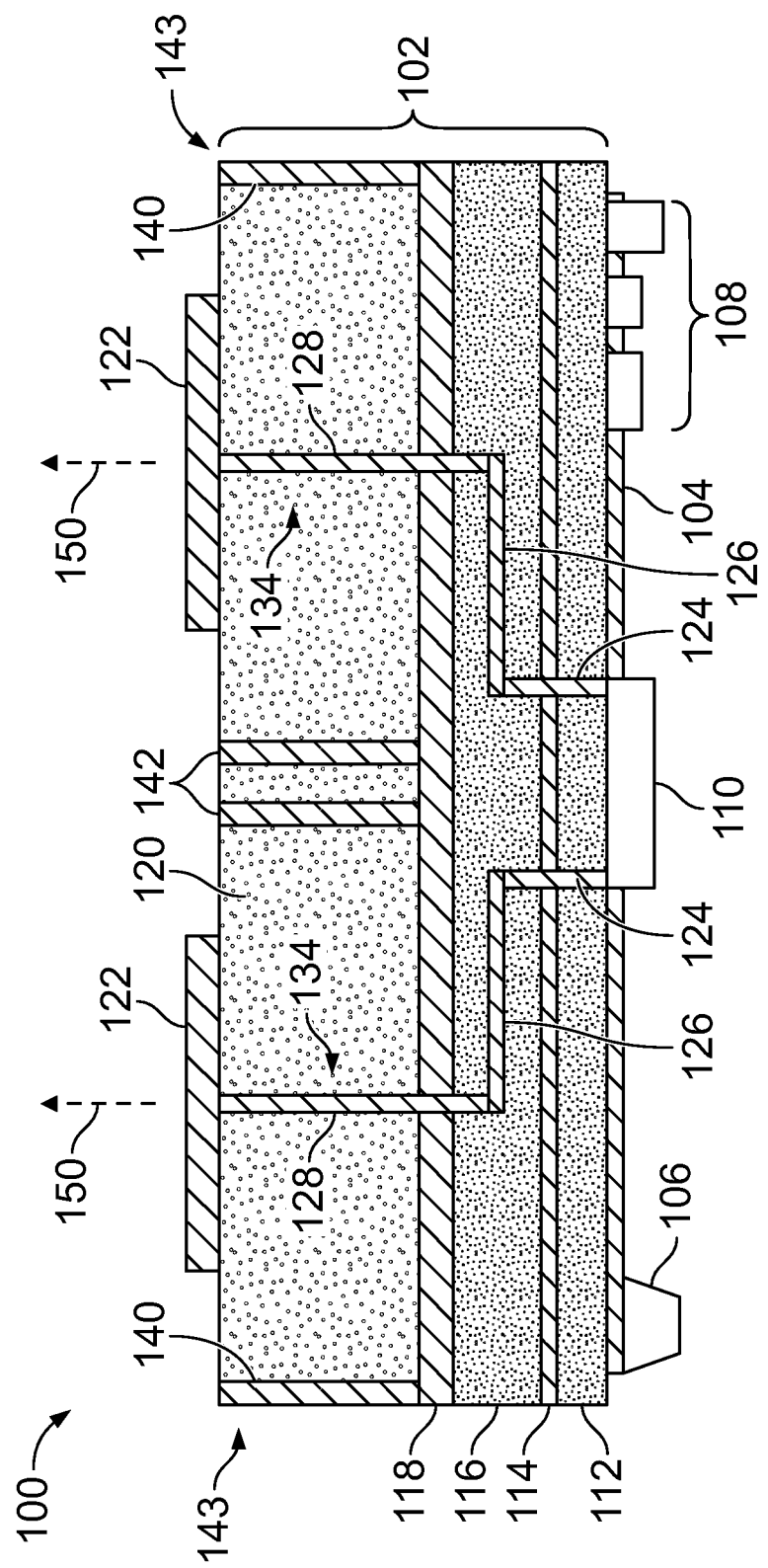
FIG. 1 illustrates a schematic diagram of an antenna system, according to an example of the present disclosure.

The foregoing summary, as well as the following detailed description of certain examples will be better understood when read in conjunction with the appended drawings. As used herein, an element or step recited in the singular and preceded by the word "a" or "an" should be understood as not necessarily excluding the plural of the elements or steps. Further, references to "one example" are not intended to be interpreted as excluding the existence of additional examples that also incorporate the recited features. Moreover, unless explicitly stated to the contrary, examples "comprising" or "having" an element or a plurality of elements having a particular condition can include additional elements not having that condition.

Examples of the present disclosure provide a flexible, phased array antenna assembly that includes a flexible printed circuit board (PCB) substrate. The assembly can be mounted conformally to a surface where the implementation of a rigid structure may not be feasible. The assembly is configured for beam steering, and is scalable from a small array to a large array by combining more of the unit cell designs into a larger structure.

The antenna systems and methods described herein eliminate, minimize, or otherwise reduce a need for a high cost, large, and rigid phased array to produce a steerable beam pattern. Examples of the present disclosure provide low cost phased array antenna systems that are configured for use with low-cost, expendable mission systems, for example. In at least one example, a low cost conformal phased array is provided that can be used with 5G communication channels.

Examples of the present disclosure provide flexible phased array systems that can applied to any surface within a desired minimum radius of curvature. In contrast, conformal rigid structures are application specific and cannot be used across platforms. Examples of the present disclosure provide flexible phased array systems that can be mounted on various surfaces, such as interior or exterior portions of an aircraft.

In at least one example, the antenna system includes a phase matching layer for electrical traces with vias that connect to a control unit, such as a radio frequency (RF) integrated circuit (IC). The antenna system includes a flexible printed circuit board (PCB), which can be formed of flexible materials. In at least one example, the flexible PCB includes flexible hybrid electronics. The flexible PCB can include multiple layers, each of which can be formed of a flexible material, such as a thermoplastic polyurethane-based material. The phase matching layer can include traces between antennas that are equal in length. By having equal trace length antenna connections on a flexible PCB, the flexible PCB can conform to different surfaces, such as along a cylindrical surface or a cylindrical biaxial surface (for example, a saddle surface).

In at least one example, an antenna system includes a flexible PCB including a flexible substrate made of a flexible material that allows the flexible PCB to flex. Communication circuitry can be mounted on the flexible substrate. The communication circuitry is configured to communicate electrical signals. A phased array having a plurality of antennas mounted on the flexible substrate. Each antenna is electrically connected to the communication circuitry, such as by a matching trace length. In at least one example, the flexible substrate includes a phase matching layer having electrical traces between each antenna and the communication circuitry such that a zero degree phase taper centers the beam along a boresight axis. The phased array of antennas creates a beam of radio waves that can be electronically steered in different directions. The phase matching layer of electrical traces may be connected to other layers of the flexible substrate by using vias filled with printed or plated conductive material.

FIG. 1 illustrates a schematic diagram of an antenna system 100, according to an example of the present disclosure. The antenna system 100 is a flexible, phased array antenna system. The antenna system 100 includes a flexible printed circuit board (PCB) 102, which can include a plurality of layers. The flexible PCB 102 is formed of a flexible material, such as a thermoplastic polyurethane-based material. In at least one example, the flexible PCB 102 is formed of one or more acrylic-based copper-clad laminates. As another example, the flexible PCB 102 is formed of one or more layers of polyethylene terephthalate (PET). As another example, the flexible PCB 102 is formed of one or more layers of liquid crystal polymer.

The flexible PCB 102 includes a component layer 104 to which one or more components can be mounted. The components can include connector hardware 106 and one or more low frequency passive devices 108, such as non-RF devices (for example, control buses, decouplers, microcontrollers, and/or the like). Optionally, the flexible PCB 102 may not include the connector hardware 106 and/or the low frequency passive devices 108. In at least one example, the component layer 104 can be a ground layer.

A control unit 110 is secured to the flexible PCB 102. For example, the control unit 110 can be mounted on and/or within the component layer 104. In at least one example, the control unit 110 is an RF IC. In at least one example, the control unit 110 is or otherwise includes a ball grid array (BGA) or a quad flat no-lead (QFN) package.

A first dielectric layer 112 is secured to the component layer 104. In at least one example, the first dielectric layer 112 is part of the component layer 104. An intermediate ground layer 114 can, in turn, be secured to the first dielectric layer 112, such as that first dielectric layer 112 is sandwiched between the component layer 104 and the intermediate ground layer 114. The intermediate ground layer 114 can be a ground layer for signal and non-RF traces, for example. Optionally, the flexible PCB 102 may not include the intermediate ground layer 114.

A second dielectric layer 116 (such as a phase matching layer) is secured to the intermediate ground layer 114, such that the intermediate ground layer 114 is sandwiched between the second dielectric layer 116 and the first dielectric layer 112. Optionally, if no intermediate ground layer 114 is used, the first dielectric layer 112 and the second dielectric layer 116 can be combined into a single, unitary dielectric layer. In at least one example, the phase matching layer can be on the same layer as the antenna elements.

An RF ground layer 118 is secured to the second dielectric layer 116, such that the second dielectric layer 116 is sandwiched between the RF ground layer 118 and the intermediate ground layer 114. A third dielectric layer 120 (such as an antenna layer) is secured to the RF ground layer 118, such that the RF ground layer 118 is sandwiched between the third dielectric layer 120 and the second dielectric layer 116.

A plurality of antenna elements 122 are mounted on the third dielectric layer 120. The antenna elements 122 can be patch antennas, for example. As shown, the antenna system 100 can include two or more antenna elements 122. Optionally, instead of antenna elements, one or more SMA ports can be mounted on the third dielectric layer 120, or otherwise coupled to an antenna layer. In at least one example, the dielectric layer 120 can include antenna elements 122 and one or more SMA ports.

First vias 124 electrically connect to the control unit 110 and extend through the first dielectric layer 112 and the intermediate ground layer 114 to the second dielectric layer 116. The second dielectric layer 116 is an example of a phase matching layer. Each of the first vias 124 electrically connects to a phase match trace 126, which is on and/or within the phase matching layer (for example, the second dielectric layer 116). Each phase match trace 126, in turn, connects to a second via 128, which extends through the second dielectric layer 116, the RF ground layer 118, and the third dielectric layer 120 to electrically connect to a respective antenna element 122, such as via direct connection, proximity coupling, or the like.

In at least one example, the first vias 124 are the same length. That is, each of the first vias 124 has an equal length. Similarly, the phase match traces 126 are the same length (that is, equal length). Further, the second vias 128 are the same length (that is, equal length). In at least one example, each of the phase match traces 126 in the phase matching layer are the same length. As shown, a signal path 134 between the control unit 110 and each of the antenna elements 122 includes a first via 124, a phase match trace 126, and a second via 128. In at least one example, the length of each signal path 134 is the same. The signal paths 134 can include more or less vias than shown. For example, a signal path can include a phase match trace extending from the control unit 110 and a single via that connects the phase match trace to an antenna element 122.

Outer isolating vias 140 extend through the third dielectric layer 120 to outer sides of the vias 128. Inner isolating vias 142 extend through the third dielectric layer 120 to inner sides of the vias 128. The outer isolating vias 140 and the inner isolating vias 142 can be RF vias that isolate the antenna elements 122 and respective vias 128 from one another. In this manner, the outer isolating vias 140 and the inner isolating vias 142 provide an RF via fence 143 in relation to the antenna elements 122 and respective vias 128 that eliminates, minimizes, or otherwise reduces electromagnetic interference, cross talk, and the like therebetween. As shown, a plurality of RF fences 143 are disposed within the antenna layer 120. Each of the RF fences 143 is associated with a respective one of the antenna elements 122. Alternatively, the antenna system 100 may not include the RF via fences.

The antenna elements 122 of the antenna system 100 are configured as a phase array. A single control unit, such as the control unit 110, connects to each of the antenna elements 122 through a respective signal path 134. As noted, each of the signal paths 134 can be the same length. The single control unit 110 provides an independent phase controllable source, which allows beams emitted from the antenna elements 122 to be steered as desired.

As noted, each of the phase match traces 126 in the phase match layer (for example, the second dielectric layer 116) is the same length. In at least one example, each signal path 134 is the same length. As such, when the antenna system 100 is activated, beams emitted from each of the antenna elements 122 are oriented at boresight 150. In contrast, if the lengths of the signal paths 134 were mismatched, when the antenna system 100 was activated, the emitted beams would be directed in arbitrary directions (if no phase taper was applied). As such, providing the signal paths 134 with the same lengths allows for reliable, consistent, and simple operation.

As noted, the flexible PCB 102 can include a plurality of dielectric layers and ground layers. The flexible PCB 102 can include more or fewer dielectric layers and ground layers than shown. The layers can be scaled based on appropriate wavelength thicknesses and materials, as desired. In at least one example, the layers can have thicknesses ranging from 1-10 millimeters (mm). Optionally, the layers can have a thickness less than 1 mm or greater than 10 mm.

In at least one example, the antenna assembly 100 secures to a conformal surface (such as that of a portion of an aircraft) such that the antenna elements 122 on the dielectric layer 120 directly abut the conformal surface. Optionally, the antenna elements 122 can be recessed into or embedded within the dielectric layer 120. The phase matching layer having the phase match traces 126 (for example, the dielectric layer 116) ensures that the delay to all the antenna elements 122 is the same. The control unit 110, the connector hardware 106, and the devices 108 can be disposed on the layer 104, which can be an outer layer that is distally located from the conformal surface.

As described herein, the antenna system 100 is a phased array antenna system including the flexible printed circuit board 102. The flexible printed circuit board 102 includes the component layer 104, the antenna layer (for example, the dielectric layer 120), and the phase matching layer (for example, the dielectric layer 116) between the component layer 104 and the antenna layer 120. The control unit 110 is coupled to (for example, mounted on and/or within) the component layer 104. The plurality of antenna elements 122 are coupled to (for example, mounted on and/or within) the antenna layer 120. The plurality of signal paths 134 extend through the component layer 104, the phase matching layer 116, and the antenna layer 120. Each of the plurality of signal paths 134 connects the control unit 110 to a respective one of the plurality of antenna elements 122. In at least one example, each of the plurality of signal paths 134 has an equal length. In at least one example, each of the plurality of signal paths 134 includes a phase match trace 126 on or within the phase matching layer 116. In at least one example, the phase match trace 126 for each of the plurality of signal paths 134 has an equal length. At least one ground layer (for example, the ground layer 114) can be disposed between the component layer 104 and the phased array matching layer 116. At least one ground layer (for example, the ground layer 118) can be disposed between the antenna layer 120 and the phased array matching layer 116.

As used herein, the term "control unit," "central processing unit," "unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control unit 110 may be or include one or more processors that are configured to control operation thereof, as described herein.

The control unit 110 is configured to execute a set of instructions that are stored in one or more data storage units or elements (such as one or more memories), in order to process data. For example, the control unit 110 may include or be coupled to one or more memories. The data storage units may also store data or other information as desired or needed. The data storage units may be in the form of an information source or a physical memory element within a processing machine.

The set of instructions may include various commands that instruct the control unit 110 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the control unit 110. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control unit 110 may represent processing circuitry such as one or more of a field programmable gate array (FPGA), application specific integrated circuit (ASIC), microprocessor(s), and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

Figure 2:
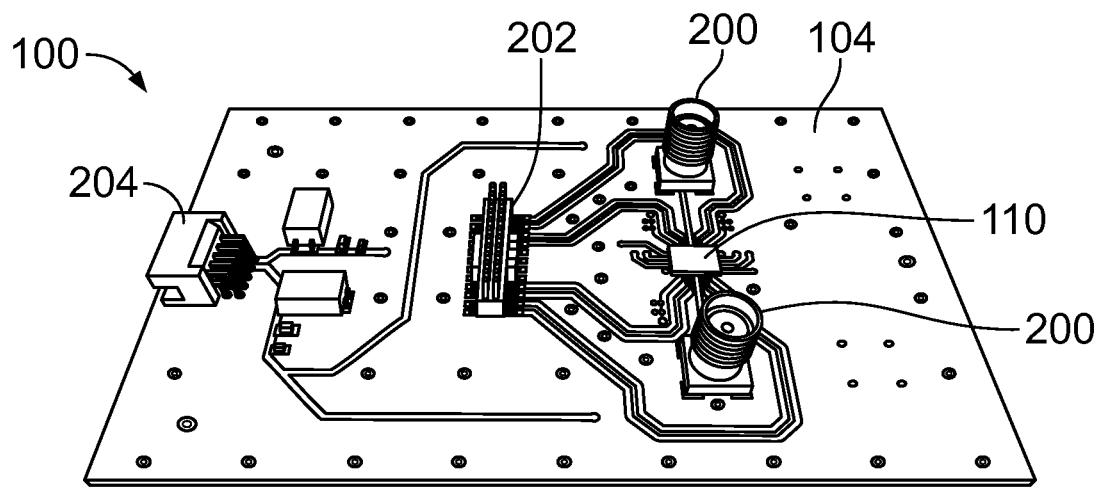
FIG. 2 illustrates a perspective top view of an antenna system, according to an example of the present disclosure.
Figure 3:
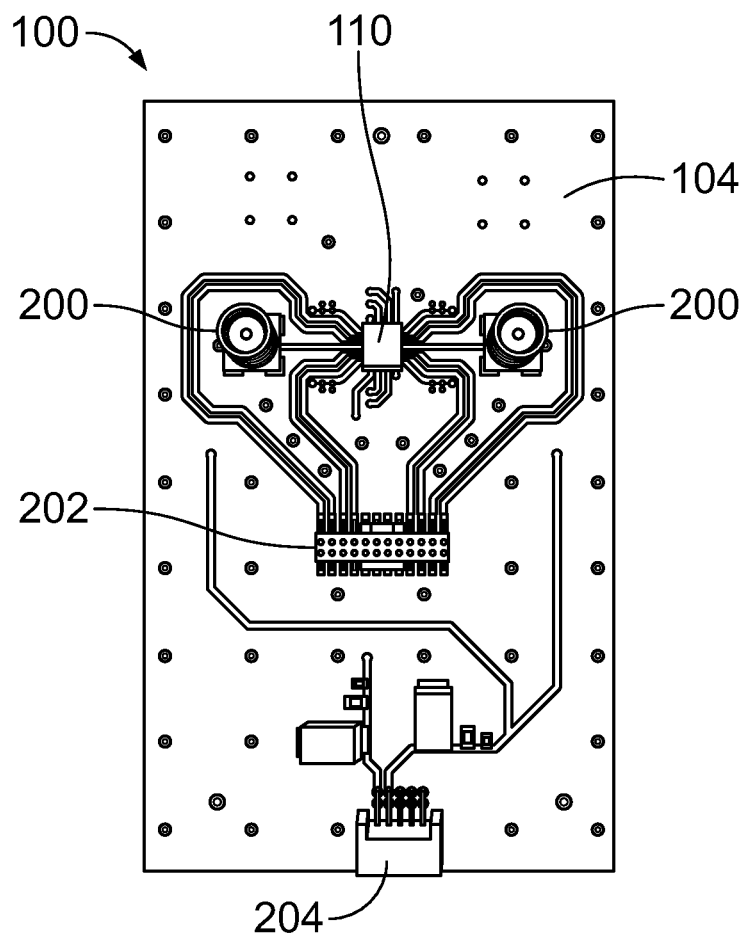
FIG. 3 illustrates a top view of the antenna system of FIG. 2.

FIG. 2 illustrates a perspective top view of an antenna system 100, according to an example of the present disclosure. FIG. 3 illustrates a top view of the antenna system 100 of FIG. 2. Referring to FIGS. 2 and 3, the control unit 110 is mounted on the component layer 104. Signal outputs 200, a control connector 202, and a power connector 204 can also be mounted on the component layer 104. More or few components than shown can be mounted on the component layer 104.

In general, the component layer 104 supports surface mounted components. The component layer 104 may or may not include RF components. In at least one example, the component layer 104 can include one or more capacitors for stabilizing power signals.

As noted, the antenna system 100 can include a plurality of ground layers that separate various layers. The antenna system 100 can include more or fewer ground layers than shown and described.

FIG. 4 illustrates a phase matching layer 210 of the antenna system 100 of FIG. 2. The phase matching layer 116 can be the second dielectric layer 116 shown in FIG. 1. That is, the second dielectric layer 116 shown in FIG. 1 is an example of a phase matching layer. In at least one example, the phase matching layer 210 provides an RF signal routing layer. The phase matching layer 116 includes the phase match traces 126. The phase match traces 126 provide RF traces that route signals from the control unit 110 to the antenna elements 122 (shown in FIG. 1). Each of the phase match traces 126 is the same length, or substantially the same length (such as +/−0.5% difference).

FIG. 5 illustrates a top view of an antenna layer 220 of the antenna system 100 of FIG. 2. The antenna layer 220 can be the third dielectric layer 120 shown in FIG. 1. That is, the third dielectric layer 120 shown in FIG. 1 is an example of an antenna layer. The antenna elements 122 are mounted on and/or within the antenna layer 220. In at least one example, the antenna layer 220 is devoid of surface mount components, in order to flexibly conform to a surface, such as a surface of a portion of an aircraft. The antenna layer 220 can include one or more power traces 240, which can be isolated from the antenna elements 122 by ground vias. Each of the antenna elements 122 can include a plurality of antennas. Each antenna element 122 can include more or fewer antennas than shown.

Figure 6:
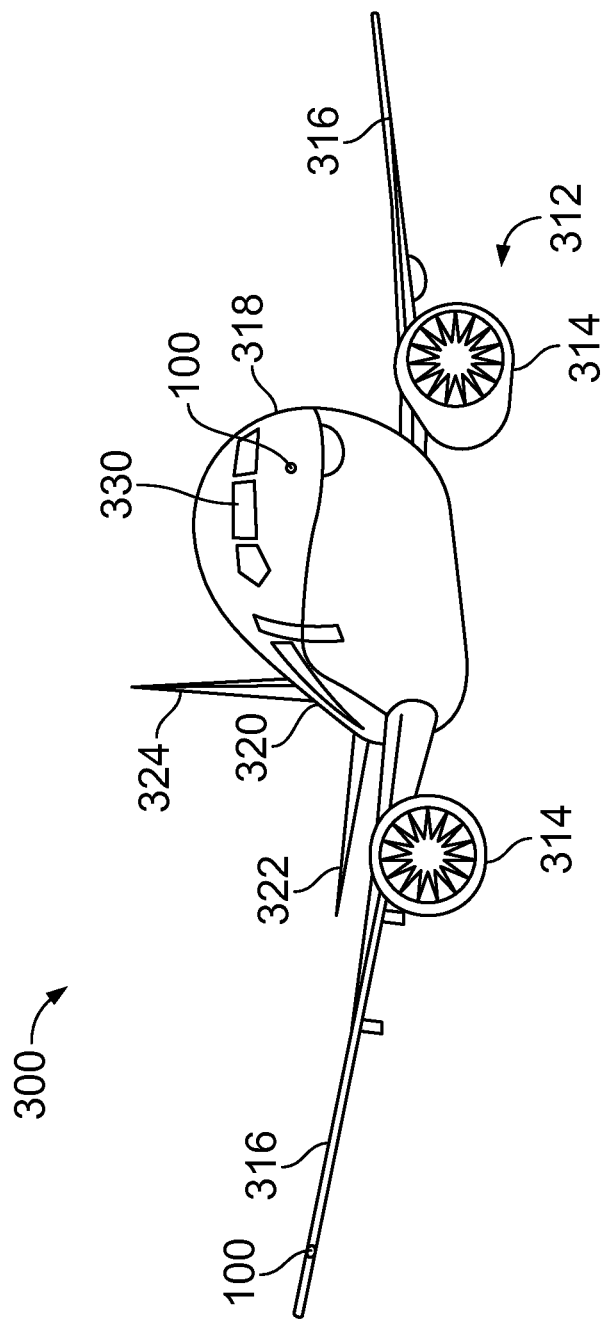
FIG. 6 illustrates a front perspective view of an aircraft, according to an example of the present disclosure.

FIG. 6 illustrates a front perspective view of an aircraft 300, according to an exemplary embodiment of the present disclosure. The aircraft 300 includes a propulsion system 312 that can include two turbofan engines 314. Optionally, the propulsion system 312 can include turbojet engines, turboprop engines, or turboshafts (such as commonly used with helicopters). Optionally, the propulsion system 312 can include more engines 314 than shown. The engines 314 are carried by wings 316 of the aircraft 300. In other examples, the engines 314 can be carried by a fuselage 318 and/or an empennage 320. The empennage 320 can also support horizontal stabilizers 322 and a vertical stabilizer 324. The fuselage 318 of the aircraft 300 defines an internal cabin, which may include a flight deck or cockpit 330.

The aircraft 300 may be sized, shaped, and configured other than shown in FIG. 6. For example, the aircraft 300 may be a non-fixed wing aircraft, such as a helicopter. As another example, the aircraft 300 can be an unmanned aerial vehicle (UAV). Optionally, examples of the present disclosure can be used with various other types of vehicles, such as automobiles, trains, watercraft, or the like. Also, optionally, examples of the present disclosure can be used with various ventilated compartments of fixed structures, such as within residential or commercial buildings.

FIG. 6 shows examples of how a conformal antenna systems 100, such can be disposed on the aircraft 300. The aircraft 100 can include one or more antenna arrays for use in a radar system. While conventional arrays are flat structures that are often hidden by radomes, the antenna systems 100 provide conformal, phase array antenna systems that are configured to conform to the surface of the aircraft 300 upon which they are mounted. The antenna systems 100 may be disposed on the wings 316, various portions of the fuselage 318, and/or the like.

As an example, a conformal, phased array antenna system 100 can be secured near the front of the aircraft 300. In another example, a conformal, phase array antenna system 100 can be secured on and/or proximate to an edge of a wing 316. The antenna systems 100 can be secured to surfaces that are not flat. Additionally, by using a conformal system, such as the antenna system 100, aircraft structure may be designed without the need to create dedicated space for a radar array and radome. Instead, the antenna systems 100 can be mounted on the aircraft 300 after the aircraft structure is designed and built.

Further, the disclosure comprises examples according to the following clauses:

Clause 1. A phased array antenna system comprising:
a flexible printed circuit board formed of a flexible material, the flexible printed circuit board comprises a component layer, an antenna layer, and a phase matching layer between the component layer and the antenna layer;
a control unit coupled to the component layer;
a plurality of antenna elements coupled to the antenna layer; and
a plurality of signal paths extending through the component layer, the phase matching layer, and the antenna layer, wherein each of the plurality of signal paths connects the control unit to a respective one of the plurality of antenna elements, and wherein the control unit provides an independent phase controllable source, which allows beams emitted from the antenna elements to be steered.

Clause 2. The phased array antenna system of Clause 1, wherein each of the plurality of signal paths has an equal length.

Clause 3. The phased array antenna system of Clauses 1 or 2, wherein each of the plurality of signal paths comprises a phase match trace on or within the phase matching layer.

Clause 4. The phased array antenna system of Clause 3, wherein the phase match trace for each of the plurality of signal paths has an equal length.

Clause 5. The phased array antenna system of any of Clauses 1-4, wherein each of the plurality of signal paths comprises one or more vias.

Clause 6. The phased array antenna system of any of Clauses 1-5, wherein each of the plurality of signal paths comprises:
a first via connected to the control unit;
a phase match trace connected to the first via; and
a second via connected to the phase match trace.

Clause 7. The phased array antenna system of any of Clauses 1-6, further comprising at least one ground layer disposed between the component layer and the phased array matching layer.

Clause 8. The phased array antenna system of any of Clauses 1-7, further comprising at least one ground layer disposed between the antenna layer and the phased array matching layer.

Clause 9. The phased array antenna system of any of Clauses 1-8, further comprising a plurality of radio frequency (RF) fences disposed within the antenna layer, wherein each of the RF fences is associated with a respective one of the plurality of antenna elements.

Clause 10. A phased array antenna method comprising:
coupling a control unit to a component layer of a flexible printed circuit board formed of a flexible material;
coupling a plurality of antenna elements to an antenna layer of the flexible printed circuit board; and
providing a plurality of signal paths through the component layer, a phase matching layer of the flexible printed circuit board, and the antenna layer, wherein the phase matching layer is between the component layer and the antenna layer, wherein said providing comprises connecting each of the plurality of signal paths to the control unit and a respective one of the plurality of antenna elements, and wherein the control unit provides an independent phase controllable source, which allows beams emitted from the antenna elements to be steered.

Clause 11. The phased array antenna method of Clause 10, wherein each of the plurality of signal paths has an equal length.

Clause 12. The phased array antenna method of Clauses 10 or 11, wherein each of the plurality of signal paths comprises a phase match trace on or within the phase matching layer.

Clause 13. The phased array antenna method of Clause 12, wherein the phase match trace for each of the plurality of signal paths has an equal length.

Clause 14. The phased array antenna method of any of Clauses 10-13, wherein each of the plurality of signal paths comprises one or more vias.

Clause 15. The phased array antenna method of any of Clauses 10-14, further comprising disposing at least one ground layer between the component layer and the phased array matching layer.

Clause 16. The phased array antenna method of any of Clauses 10-15, further comprising disposing at least one ground layer between the antenna layer and the phased array matching layer.

Clause 17. The phased array antenna method of any of Clauses 10-16, further comprising disposing a plurality of radio frequency (RF) fences within the antenna layer, wherein each of the RF fences is associated with a respective one of the plurality of antenna elements.

Clause 18. A phased array antenna system comprising:
a flexible printed circuit board formed of a flexible material, the flexible printed circuit board comprises a component layer, an antenna layer, and a phase matching layer between the component layer and the antenna layer;
a control unit coupled to the component layer;
a plurality of antenna elements coupled to the antenna layer;
at least one first ground layer disposed between the component layer and the phased array matching layer;
at least one second ground layer disposed between the antenna layer and the phased array matching layer;
a plurality of radio frequency (RF) fences disposed within the antenna layer, wherein each of the RF fences is associated with a respective one of the plurality of antenna elements; and
a plurality of signal paths extending through the component layer, the phase matching layer, and the antenna layer, wherein each of the plurality of signal paths connects the control unit to a respective one of the plurality of antenna elements, wherein each of the plurality of signal paths comprises a phase match trace on or within the phase matching layer, wherein the phase match trace for each of the plurality of signal paths has an equal length, and wherein the control unit provides an independent phase controllable source, which allows beams emitted from the antenna elements to be steered.

Clause 19. The phased array antenna system of Clause 18, wherein each of the plurality of signal paths has an equal length.

Clause 20. The phased array antenna system of Clauses 18 or 19, wherein each of the plurality of signal paths comprises one or more vias.

As described herein, examples of the present disclosure provide efficient and effective flexible phased array antenna systems and method. Further, examples of the present disclosure provide flexible phased array antenna systems that are cost-effective and easier to manufacture than prior known systems.

While various spatial and directional terms, such as top, bottom, lower, mid, lateral, horizontal, vertical, front and the like can be used to describe examples of the present disclosure, it is understood that such terms are merely used with respect to the orientations shown in the drawings. The orientations can be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described examples (and/or aspects thereof) can be used in combination with each other. In addition, many modifications can be made to adapt a particular situation or material to the teachings of the various examples of the disclosure without departing from their scope. While the dimensions and types of materials described herein are intended to define the parameters of the various examples of the disclosure, the examples are by no means limiting and are exemplary examples. Many other examples will be apparent to those of skill in the art upon reviewing the above description. The scope of the various examples of the disclosure should, therefore, be determined with reference to the appended claims, along with the full scope of equivalents to which such claims are entitled. In the appended claims and the detailed description herein, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various examples of the disclosure, including the best mode, and also to enable any person skilled in the art to practice the various examples of the disclosure, including making and using any devices or systems and performing any incorporated methods. The patentable scope of the various examples of the disclosure is defined by the claims, and can include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A phased array antenna system comprising:
    a flexible printed circuit board formed of a flexible material, the flexible printed circuit board comprises a component layer, an antenna layer, and a phase matching layer between the component layer and the antenna layer;
    at least one ground layer disposed between the phase matching layer and one or both of the component layer or the antenna layer;
    a single control unit including one or more processors coupled to the component layer;
    a plurality of antenna elements coupled to the antenna layer;
    a plurality of radio frequency (RF) fences disposed within the antenna layer, wherein each of the RF fences is associated with a respective one of the plurality of antenna elements; and
    a plurality of signal paths extending through the component layer, the phase matching layer, and the antenna layer, wherein each of the plurality of signal paths connects the single control unit to a respective one of the plurality of antenna elements, wherein each of the plurality of signal paths has an equal length, and wherein the single control unit provides an independent phase controllable source, which allows beams emitted from the antenna elements to be steered.

2. The phased array antenna system of claim 1, wherein each of the plurality of signal paths comprises a phase match trace on or within the phase matching layer.

3. The phased array antenna system of claim 2, wherein the phase match trace for each of the plurality of signal paths has an equal length.

4. The phased array antenna system of claim 1, wherein each of the plurality of signal paths comprises one or more vias.

5. The phased array antenna system of claim 1, wherein each of the plurality of signal paths comprises:
    a first via connected to the single control unit;
    a phase match trace connected to the first via; and
    a second via connected to the phase match trace.

6. The phased array antenna system of claim 1, wherein the at least one ground layer is disposed between the component layer and the phase matching layer.

7. The phased array antenna system of claim 1, further comprising at least one ground layer disposed between the antenna layer and the phase matching layer.

8. A phased array antenna method comprising:
    coupling a single control unit including one or more processors to a component layer of a flexible printed circuit board formed of a flexible material;
    coupling a plurality of antenna elements to an antenna layer of the flexible printed circuit board;
    disposing at least one ground layer between a phase matching layer of the flexible printed circuit board and one or both of the component layer or the antenna layer;
    disposing a plurality of radio frequency (RF) fences within the antenna layer, wherein each of the RF fences is associated with a respective one of the plurality of antenna elements; and
    providing a plurality of signal paths through the component layer, the phase matching layer, and the antenna layer, wherein the phase matching layer is between the component layer and the antenna layer, wherein said providing comprises connecting each of the plurality of signal paths to the single control unit and a respective one of the plurality of antenna elements, wherein each of the plurality of signal paths has an equal length, and wherein the single control unit provides an independent phase controllable source, which allows beams emitted from the antenna elements to be steered.

9. The phased array antenna method of claim 8, wherein each of the plurality of signal paths comprises a phase match trace on or within the phase matching layer.

10. The phased array antenna method of claim 9, wherein the phase match trace for each of the plurality of signal paths has an equal length.

11. The phased array antenna method of claim 8, wherein each of the plurality of signal paths comprises one or more vias.

12. The phased array antenna method of claim 8, wherein said disposing the at least one ground layer comprises disposing the at least one ground layer between the component layer and the phase matching layer.

13. The phased array antenna method of claim 8, wherein said disposing the at least one ground layer comprises disposing the at least one ground layer between the antenna layer and the phase matching layer.

14. A phased array antenna system comprising:
    a flexible printed circuit board formed of a flexible material, the flexible printed circuit board comprises a component layer, an antenna layer, and a phase matching layer between the component layer and the antenna layer;

a single control unit including one more processors coupled to the component layer;

a plurality of antenna elements coupled to the antenna layer;

at least one first ground layer disposed between the component layer and the phased array matching layer;

at least one second ground layer disposed between the antenna layer and the phased array matching layer;

a plurality of radio frequency (RF) fences disposed within the antenna layer, wherein each of the RF fences is associated with a respective one of the plurality of antenna elements; and a plurality of signal paths extending through the component layer, the phase matching layer, and the antenna layer, wherein each of the plurality of signal paths connects the single control unit to a respective one of the plurality of antenna elements, and wherein each of the plurality of signal paths has an equal length.

15. The phased array antenna system of claim 14, wherein each of the plurality of signal paths comprises one or more vias.

16. The phased array antenna system of claim 5, wherein the first via has a first length, wherein the phase match trace has a second length, wherein the second via has a third length, wherein the first length is equal for each of the plurality of signal paths, wherein the second length is equal for each of the plurality of signal paths, and wherein the third length is equal for each for each of the plurality of signal paths.

17. The phased array antenna method of claim 8, wherein each of the plurality of signal paths comprises:

a first via connected to the single control unit, wherein the first via has a first length, and wherein the first length is equal for each of the plurality of signals paths;

a phase match trace connected to the first via, wherein the phase match trace has a second length, and wherein the second length is equal for each of the plurality of signal paths; and a second via connected to the phase match trace, wherein the second via has a third length, and wherein the third length is equal for each for each of the plurality of signal paths.

18. The phased array antenna system of claim 14, wherein each of the plurality of signal paths comprises a phase match trace on or within the phase matching layer, wherein the phase match trace for each of the plurality of signal paths has an equal length, and wherein the single control unit provides an independent phase controllable source, which allows beams emitted from the antenna elements to be steered.

* * * * *